United States Patent
Lo et al.

(10) Patent No.: US 8,697,460 B2
(45) Date of Patent: Apr. 15, 2014

(54) METHODS FOR PATTERING AN EPITAXIAL SUBSTRATE AND FORMING A LIGHT-EMITTING DIODE WITH NANO-PATTERNS

(75) Inventors: Hsin-Ming Lo, Jiadong Township (TW); Shih-Chang Shei, Tainan (TW)

(73) Assignee: Aceplux Optotech, Inc, Tainan (TW)

( * ) Notice: Subject to any disclaimer, the term of this patent is extended or adjusted under 35 U.S.C. 154(b) by 0 days.

(21) Appl. No.: 13/447,977

(22) Filed: Apr. 16, 2012

(65) Prior Publication Data

US 2013/0005060 A1    Jan. 3, 2013

(30) Foreign Application Priority Data

Jun. 28, 2011  (TW) .............................. 100122659 A

(51) Int. Cl.
*H01L 21/00* (2006.01)
(52) U.S. Cl.
USPC ...................... 438/29; 438/694; 257/E21.219

(58) Field of Classification Search
USPC .............. 438/29, 694; 257/E21.219, E33.074
See application file for complete search history.

(56) References Cited

U.S. PATENT DOCUMENTS

| | | | | |
|---|---|---|---|---|
| 2005/0016862 A1* | 1/2005 | Sano et al. | ..................... | 205/305 |
| 2009/0087937 A1* | 4/2009 | Kim | ............................... | 438/46 |
| 2011/0002970 A1* | 1/2011 | Parashar | ....................... | 424/401 |
| 2012/0119160 A1* | 5/2012 | Tong | ............................. | 252/506 |

* cited by examiner

*Primary Examiner* — Phuc Dang
(74) *Attorney, Agent, or Firm* — Allston L. Jones; Peters Verny, LLP

(57) ABSTRACT

A method for patterning an epitaxial substrate with nano-patterns, includes: forming a plurality of zinc oxide nano-particles on an epitaxial substrate; dry-etching the epitaxial substrate exposed from the zinc oxide nano-particles to form nano-patterns corresponding to the zinc oxide nano-particles; and removing the zinc oxide nano-particles on the epitaxial substrate. A method for forming a light-emitting diode having a patterned epitaxial substrate with the nano-patterns is also disclosed.

16 Claims, 6 Drawing Sheets

METHODS FOR PATTERNING AN EPITAXIAL SUBSTRATE AND FORMING A LIGHT-EMITTING DIODE WITH NANO-PATTERNS

CROSS-REFERENCE TO RELATED APPLICATION

This application claims priority of Taiwanese application no. 100122659, filed on Jun. 28, 2011.

BACKGROUND OF THE INVENTION

1. Field of the Invention

This invention relates to a method for patterning an epitaxial substrate and a method for forming a light-emitting diode with a patterned epitaxial substrate.

2. Description of the Related Art

Referring to FIG. 1, a conventional light-emitting diode (LED) includes an epitaxial substrate 11, a light-emitting unit 12, and an electrode unit 13. When electricity is supplied to the light-emitting unit 12 through the electrode unit 13, the light-emitting unit 12 will emit light.

Using a III-nitride LED, e.g., a gallium nitride (GaN)- based LED as an example, the III-nitride LED is constructed by epitaxially growing GaN on a sapphire substrate 11. However, the large differences in the lattice constant and the coefficient of thermoexpansion (CTE) between GaN and the sapphire epitaxial substrate 11 result in a high density of threading dislocation during formation of the light emitting unit 12, thereby limiting the emitting efficiency thereof. In addition, since the light emitting unit 12 is made from semiconductor materials with high refractive index (GaN has a refractive index of 2.5), total internal reflection is likely to occur at an interface between the light emitting unit 12 and air (air has a refractive index of 1), thereby trapping the light in the light emitting unit 12. The light-trap reduces the light extraction efficiency and emitting efficiency of the LED.

In recent years, a patterned epitaxial substrate has been used to reduce the lattice dislocation and light-trap problem.

In J. J. Chen et al., IEEE Photonics Technology Letters, Vol. 20, pp. 1193-1195, 2008, it has been suggested that a sapphire substrate with nano-patterns has higher light extraction efficiency than that having micrometer magnitude patterns. In other words, under a same surface area of the sapphire substrate, reducing the geometrical size of the pattern can increase the density of the pattern on the sapphire, thus increasing output power and light extraction efficiency.

The main methods for constructing nano-patterns on an epitaxial substrate include: step and flash imprint lithography (M. Colburn et al., Proc. SPIE, Vol. 3676, pp. 379-389, 1999); using $SiO_2$ nanospheres as etch mask to create a patterned sapphire substrate (B. Kim et al., Thin Solid Films, Vol. 516, pp. 7744-7747, 2008); contact-transferred and mask-embedded lithography (CMEL) (H. M. Lo et al., Superlattices and Microstructures, Vol. 48, pp. 358-364, 2010); and use of self-assembled metal (Ni) as an etch mask (H. Gao et al., Physica Status Solids, Vol. 205, pp. 1719-1723, 2008).

However, some drawbacks of these techniques exist. Step and flash lithography requires use of reactive ion etching and the apparatus for step and flash lithography is costly. CMEL and self-assembled metal (SAM) require metal vapor deposition, thus increasing manufacturing costs. Uneven nano-patterning in CMEL is also a problem that remains to be resolved. The cost for $SiO_2$ nanospheres is high, and controlling the size of the $SiO_2$ nanospheres is relatively difficult.

Accordingly, a simpler method for patterning the epitaxial substrate of the LED with the objective of obtaining higher light extraction efficiency is a main goal that is pursued in the field.

SUMMARY OF THE INVENTION

Therefore, an object of the present invention is to provide a method for patterning an epitaxial substrate and a method for making a light-emitting diode with a patterned epitaxial substrate, which can overcome at least one of the aforesaid drawbacks associated with the prior art.

According to a first aspect of this invention, a method for patterning an epitaxial substrate comprises:
(a) forming a plurality of zinc oxide nano-particles on an epitaxial substrate by the following substeps:
   (i) dipping the epitaxial substrate in a first solution that includes zinc ammonium complex ions such that the zinc ammonium complex ions are adsorbed on the epitaxial substrate;
   (ii) subjecting the zinc ammonium complex ions adsorbed on the epitaxial substrate to a hydrolysis reaction so as to form zinc hydroxide on the epitaxial substrate; and
   (iii) subjecting the zinc hydroxide on the epitaxial substrate to a dehydration reaction to form the zinc oxide nano-particles on the epitaxial substrate;
(b) dry-etching the epitaxial substrate exposed from the zinc oxide nano-particles to form nano-patterns corresponding to the zinc oxide nano-particles; and
(c) removing the zinc oxide nano-particles on the epitaxial substrate.

According to a second aspect of this invention, a method for forming a light-emitting diode comprises:
(a) forming a plurality of zinc oxide nano-particles on an epitaxial substrate by the following substeps:
   (i) dipping the epitaxial substrate in a first solution that includes zinc ammonium complex ions such that the zinc ammonium complex ions are adsorbed on the epitaxial substrate;
   (ii) subjecting the zinc ammonium complex ions adsorbed on the epitaxial substrate to a hydrolysis reaction so as to form zinc hydroxide on the epitaxial substrate; and
   (iii) subjecting the zinc hydroxide on the epitaxial substrate to a dehydration reaction to form the zinc oxide nano-particles on the epitaxial substrate;
(b) dry-etching the epitaxial substrate exposed from the zinc oxide nano-particles to form nano-patterns corresponding to the zinc oxide nano-particles;
(c) removing the zinc oxide nano-particles on the epitaxial substrate;
(d) epitaxial growing a semiconductor light-emitting unit on the nano-patterns of the epitaxial substrate; and
(e) forming an electrode unit for supplying electricity.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
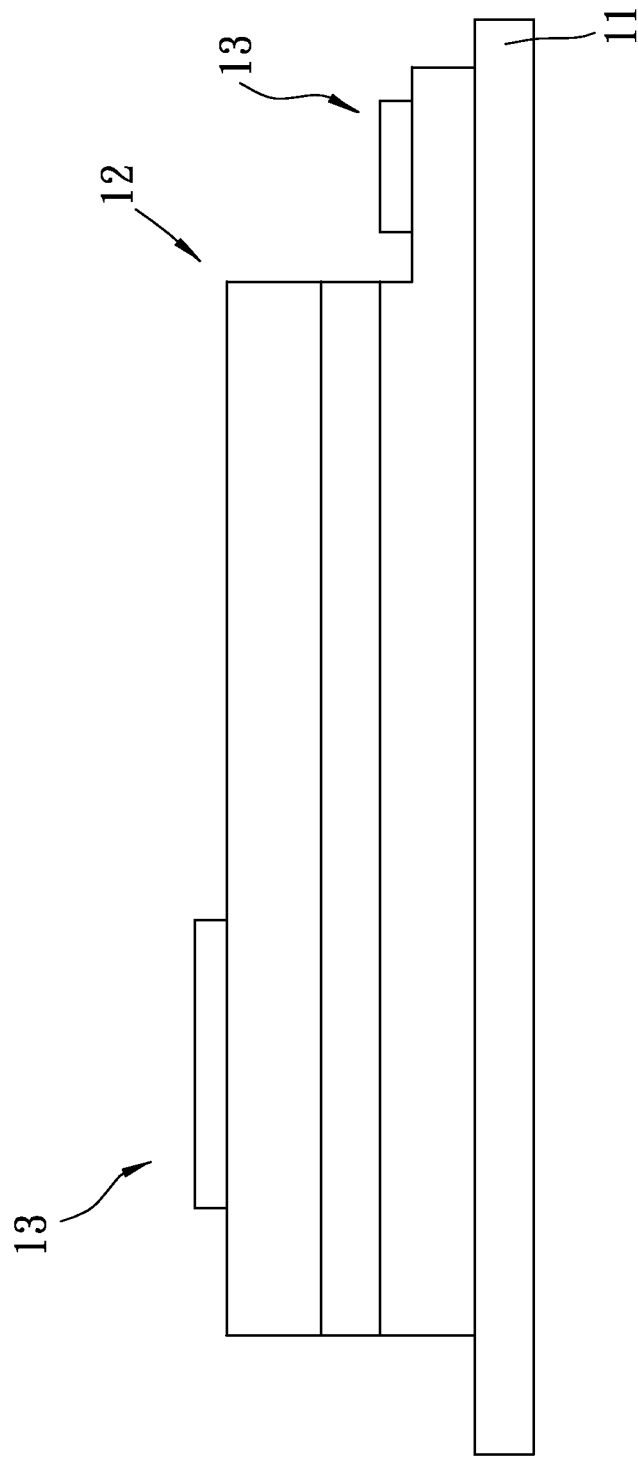
FIG. 1 is a schematic diagram of a conventional light-emitting diode.

Before the present invention is described in greater detail with reference to the accompanying preferred embodiments, it should be noted herein that like elements are denoted by the same reference numerals throughout the disclosure.

Figure 2:
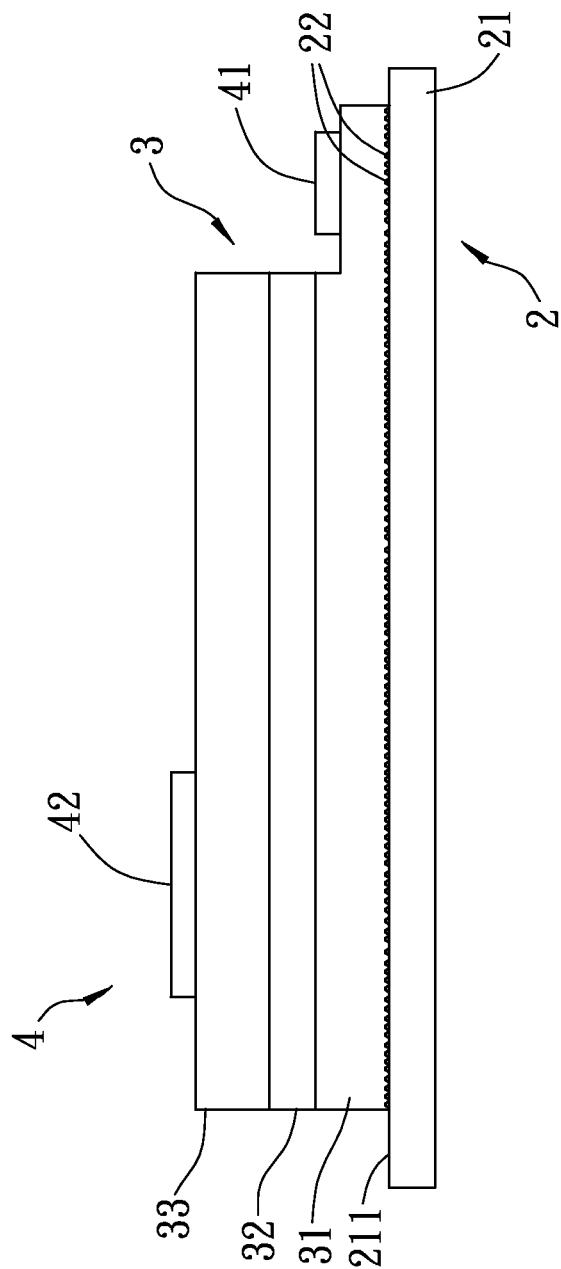
FIG. 2 is a schematic diagram of a light-emitting diode made by the preferred embodiment of a method for forming a light-emitting diode according to this invention.

This invention provides a method for forming a light-emitting diode (LED) having a structure shown in FIG. 2. The light-emitting diode (LED) includes an epitaxial substrate 2, a semiconductor light-emitting unit 3 and an electrode unit 4.

The epitaxial substrate 2 includes a base member 21 and nano-patterns 22 formed on a surface 211 of the base member 21.

The semiconductor light-emitting unit 3 includes a first-type semiconductor layer 31 that is positioned on the surface 211 of the base member 21 and the nano-patterns 22. A second-type semiconductor layer 33 is formed above the first-type semiconductor layer 31 with a light-emitting layer 32 sandwiched therebetween. The first-type semiconductor layer 31 and the second-type semiconductor layer 33 possess electrical properties opposite from each other.

The electrode unit 4 consists of a bottom electrode 41 and a top electrode 42 formed on the first-type semiconductor layer 31 and the second-type semiconductor layer, respectively. Since the materials for forming the light-emitting unit 3 and the electrode unit 4 are well-known in the art, detailed descriptions thereof are omitted herein for the sake of brevity.

When electricity is applied to the semiconductor light-emitting unit 3 via the top and bottom electrodes 42, 41, the light-emitting layer 32 emits light by virtue of a photovoltaic effect. After the light from the light-emitting layer 32 travels toward the epitaxial substrate 2 and the nano-patterns 22, it may be reflected or refracted so as to vary the travelling direction of the light and to emit the light outwardly, thereby enhancing the light extraction efficiency of the LED of this invention. In addition, the difference in the refractive index between the nano-patterns 22 and the base member 21 may lead to reflection and secondary refraction, thereby enhancing the light extraction efficiency of the LED.

Figure 3:
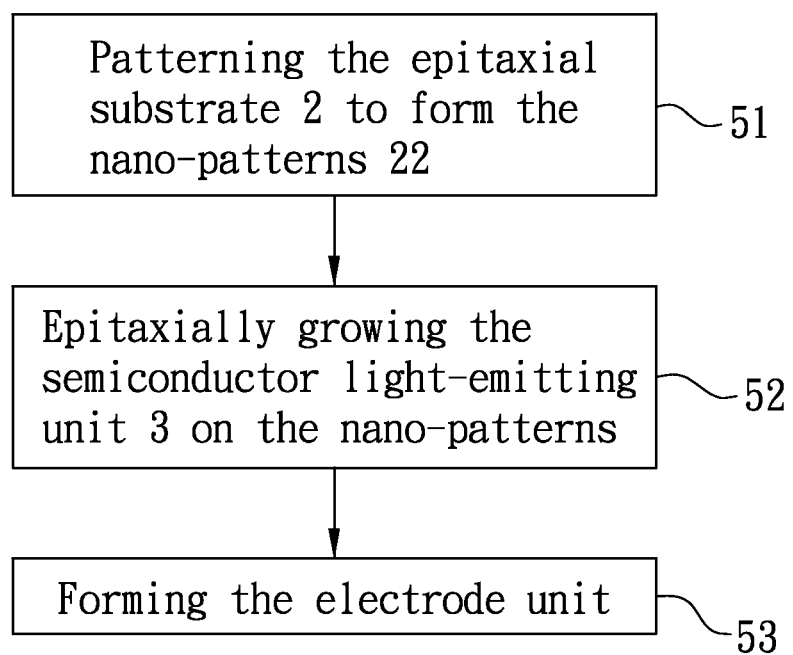
FIG. 3 is a flow chart showing the preferred embodiment of a method for forming the light-emitting diode shown in FIG. 2.

Referring to FIG. 3, the method for forming the LED according to this invention includes patterning the epitaxial substrate 2 to form the nano-patterns 22 (step 51), epitaxially growing the semiconductor light-emitting unit 3 (step 52), and forming the electrode unit 4 (step 53).

Specifically, step 51 includes forming a plurality of zinc oxide nano-particles 100 (see FIG. 4) on the epitaxial substrate 2, dry-etching the epitaxial substrate 2 exposed from the zinc oxide nano-particles 100 to form nano-patterns 22, and removing the zinc oxide nano-particles 100 from the epitaxial substrate 2. Formation of the zinc oxide nano-particles 100 includes three sub-steps (i), (ii) and (iii).

Figure 4:
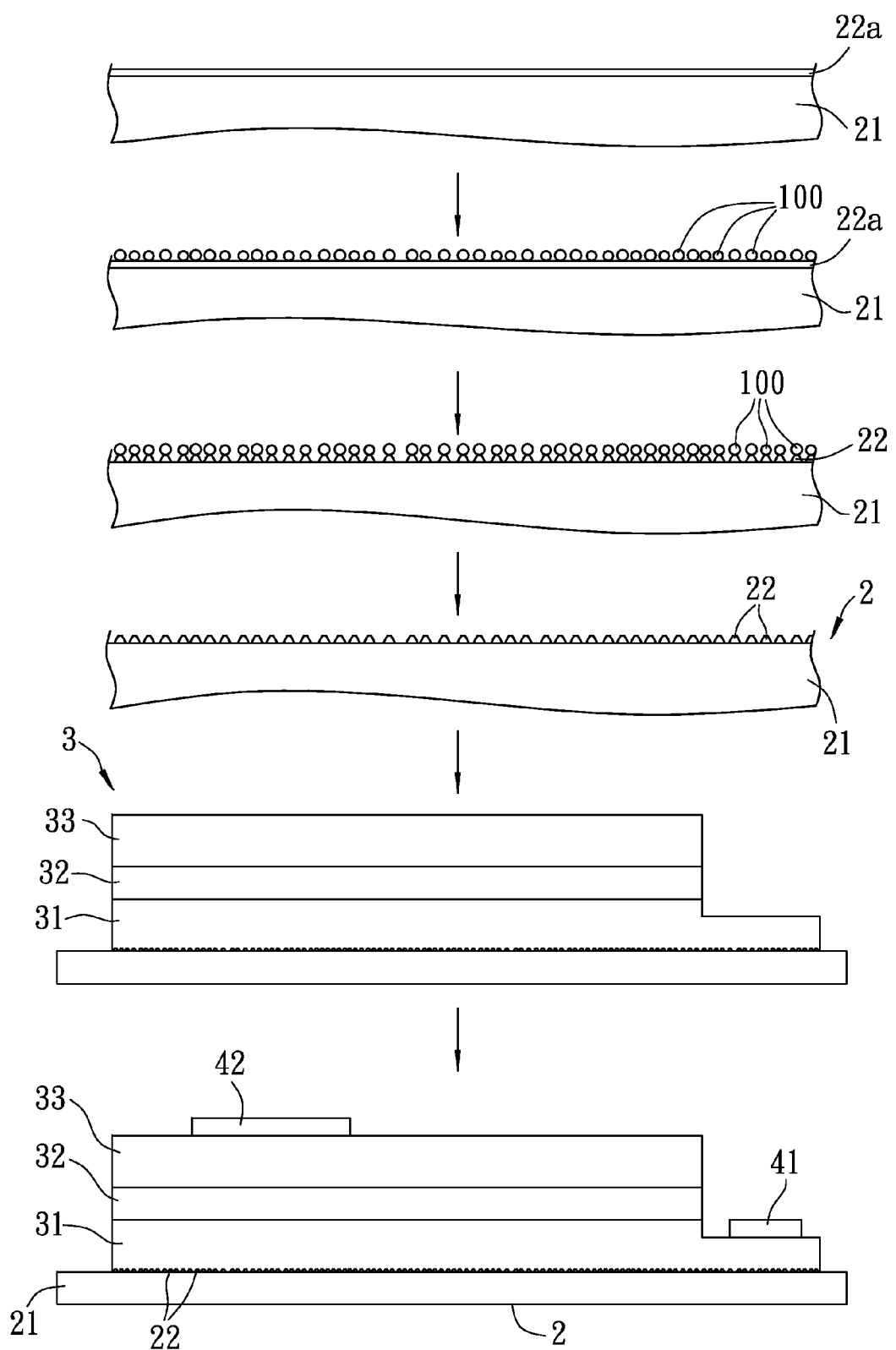
FIG. 4 shows consecutive steps of the preferred embodiment shown in FIG. 3.
Figure 5:
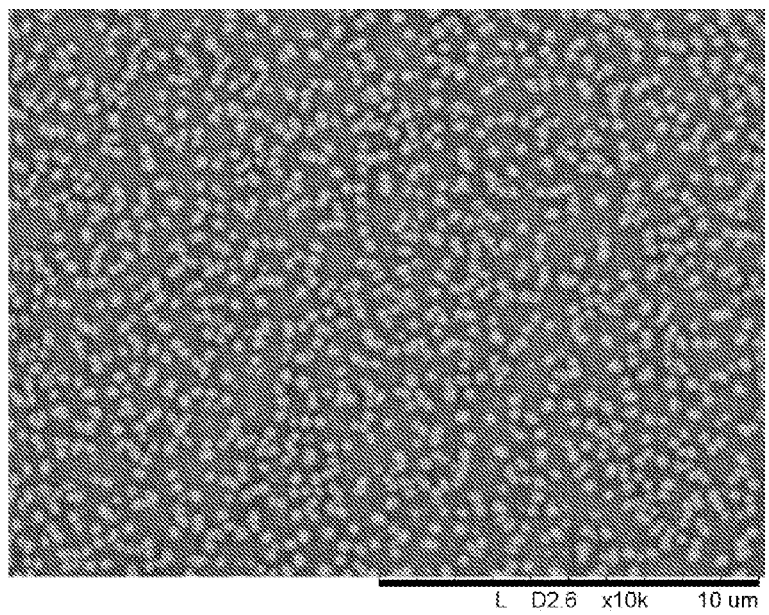
FIG. 5 is a scanning electron microscopy (SEM) image of zinc oxide nano-particles formed on an epitaxial substrate at a concentration of zinc ammonium complex ions being 0.166 mol/L.
Figure 6:
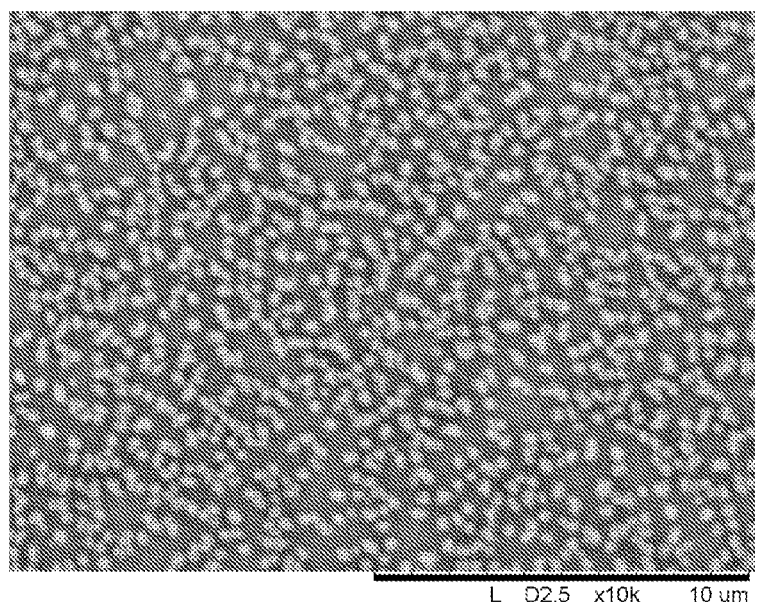
FIG. 6 is a SEM image of zinc oxide nano-particles formed on the epitaxial substrate at a concentration of zinc ammonium complex ions being 0.15 mol/L.
Figure 7:
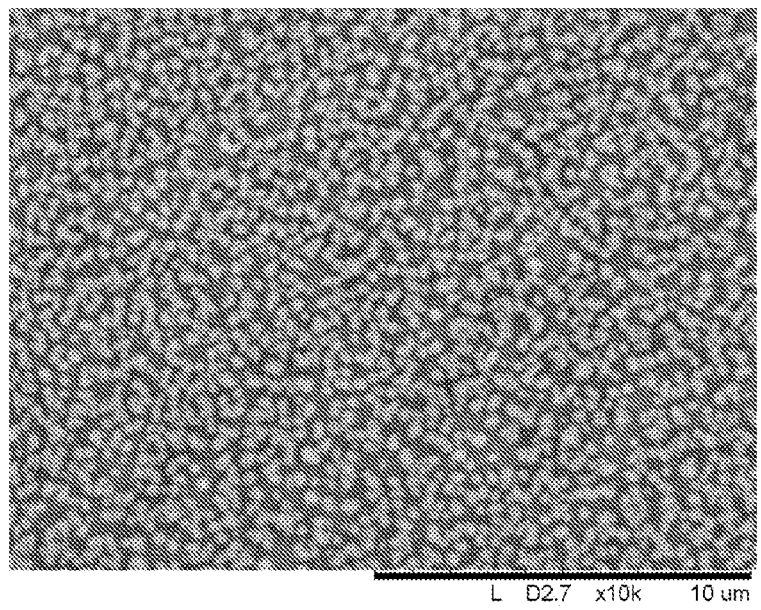
FIG. 7 is a SEM image of zinc oxide nano-particles formed on the epitaxial substrate at a concentration of zinc ammonium complex ions being 0.133 mol/L.
Figure 8:
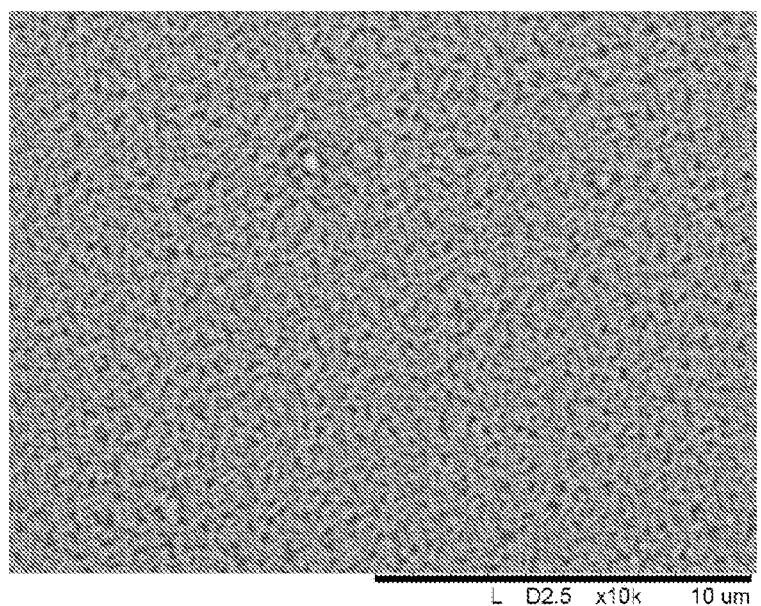
FIG. 8 is a SEM image of zinc oxide nano-particles formed on the epitaxial substrate at a concentration of zinc ammonium complex ions being 0.118 mol/L.

The first sub-step (i) involves dipping the epitaxial substrate 2 in a first solution that includes zinc ammonium complex ions ($Zn(NH_3)_4^{2+}$) with a pH not greater than 10. As best shown in FIG. 4, the epitaxial substrate 2 includes a base member 21 and an etched layer 22a formed thereon. The first solution is obtained by dissolving zinc chloride ($ZnCl_2$) in an ammonia-water solution, thereby forming zinc ammonium complex ions ($Zn(NH_3)_4^{2+}$). The zinc ammonium complex ions ($Zn(NH_2)_4^{2+}$) are adsorbed on the epitaxial substrate 2. Specifically, when the epitaxial substrate is immersed in the first solution, the zinc ammonium complex ions ($Zn(NH_2)_4^{2+}$) are adsorbed on a surface of the etched layer 22a (i.e., ion adsorption), thereby forming an ion adsorption layer.

Materials for the base member 21 include silicon, aluminum oxide, silicon carbide, and aluminum nitride. Materials for the etched layer 22a include silicon oxide, silicon oxynitride, silicon nitride, and magnesium fluoride ($MgF_2$). The preferred materials for the base member 21 and the etched layer 22a are aluminum oxide (e.g., sapphire) and silicon oxide respectively.

The second sub-step (ii) involves hydrolysis of the zinc ammonium complex ions ($Zn(NH_3)_4^{2+}$) adsorbed on the etched layer 22a to form zinc hydroxide thereon. Specifically, the epitaxial substrate 2 formed with the zinc ammonium complex ions ($Zn(NH_3)_4^{2+}$) is immersed in water having a temperature not greater than 35° C. such that the zinc ammonium complex ions ($Zn(NH_2)_4^{2+}$) are hydrolyzed to form insoluble zinc hydroxide ($Zn(OH)_2)_s$ on the etched layer 22a.

The last sub-step (iii) involves dehydration of zinc hydroxide ($Zn(OH)_2)_s$ on the etched layer 22a in a second solution having a high temperature, thereby forming a plurality of zinc oxide nano-particles 100 on the etched layer 22a.

Preferably, the second solution is water.

Preferably, the temperature of the second solution is not lower than 80° C.; more preferably, not lower than 90° C.; most preferably, not lower than 95° C.

Formation of the zinc oxide nano-particles is represented by the following reaction formulas:

$$Zn^{2+} + 4NH_4OH \rightarrow [Zn(NH_3)_4]^{2+} + 4H_2O$$

$$[Zn(NH_3)_4]^{2+} + 4H_2O \rightarrow Zn^{2+} + 4NH_4^+ + 4OH^-$$

$$Zn^{2+} + 2OH^- \rightarrow Zn(OH)_2(s)$$

$$Zn(OH)_2 \rightarrow ZnO(s) + H_2O$$

When the epitaxial substrate 2 lacks the etched layer 22a, the zinc ammonium complex ions ($Zn(NH_3)_4^{2+}$) can be directly adsorbed on the base member 21, thereby enabling direct etching of the base member 21.

The size and distribution density of the zinc oxide nano-particles 100 can be controlled by the concentration of zinc ammonium complex ions ($Zn(NH_3)_4^{2+}$). Preferably, the concentration of the zinc ammonium complex ions ($Zn(NH_3)_4^{2+}$) is not less than 0.1 mol/L; more preferably, from 0.1 mol/L to 0.2 mol/L. The zinc oxide nano-particles 100 are used as an etch mask during the following etching steps. The masking effect is determined by the gaps among the zinc oxide nano-particles 100. That is, when the gaps are too large (i.e., when the size of zinc oxide nano-particles 100 on the etched layer 22a is too small or presented in small amount), the masking effect is undesirable, thereby giving rise to unsatisfactory nano-patterns. Conversely, when the gaps are too small (i.e., when the size of zinc oxide nano-particles 100 on the etched layer 22a is excessively big or presented in large amount), this results in a longer time of forming the nano-patterns 22 and insufficient roughness of the epitaxial substrate 2.

Preferably, the average particle size of the zinc oxide nano-particles 100 ranges from 100 to 500 nm, and an average gap between two adjacent ones of the zinc oxide nano-particles 100 ranges from 100 to 500 nm.

The second solution in sub-step (iii) can include ethylene glycol. Addition of ethylene glycol increases the dehydration reaction temperature due to the high boiling point of ethylene glycol. Moreover, the zinc oxide nano-particles 100 have good dispersibility in ethylene glycol. Thus, the particle size of the zinc oxide nano-particles 100 could be well-controlled by virtue of ethylene glycol. Preferably, the volume ratio of ethylene glycol to water is in the range of 1:1 to 1:4.

In order to obtain the zinc oxide nano-particles 100 with larger and even particle size, sub-steps (i) to (iii) can be repeated.

FIGS. 5 to 8 show scanning electron microscopy (SEM) images of the zinc oxide nano-particles 100 formed on the epitaxial substrate 2 made from different concentrations of the zinc ammonium complex ions ($Zn(NH_3)_4^{2+}$). Specifically, the zinc oxide nano-particles 100 in FIGS. 5 to 8 were made from the zinc ammonium complex ions ($Zn(NH_3)_4^{2+}$) having concentrations of 0.166, 0.15, 0.133 and 0.118 mol/L respectively and were obtained by repeating sub-steps (i) to (iii) for six times. In sub-step (iii), an ethylene glycol/water solution (1/1, volume ratio) was used as the second solution. Images shown in FIGS. 5 to 8 suggest that the size and distribution density of the zinc oxide nano-particles 100 can be controlled by the concentration of the zinc ammonium complex ions ($Zn(NH_3)_4^{2+}$).

As shown in FIG. 4, etching is subsequently performed after the formation of the zinc oxide nano-particles 100 on the etched layer 22a so as to form nano-patterns 22 corresponding to the zinc oxide nano-particles 100. In the etching step, the zinc oxide nano-particles 100 serve as an etch mask, protecting the etched layer 22a from being completely etched.

Specifically, the etched layer 22a exposed from the zinc oxide nano-particles 100 is dry-etched using, e.g., inductively coupled plasma (ICP) or reactive-ion etching (RIE) techniques.

The dry-etching step is followed by the removal of the zinc oxide nano-particles 100 from the epitaxial substrate 2. In this step, the zinc oxide nano-particles 100 were dissolved and removed using a hydrochloric acid solution.

After completion of sub-steps (i) to (iii) of step 51, the semiconductor light-emitting unit 3 is formed on the nano-patterns 22 of the epitaxial substrate 2 (step 52) using a metal organic chemical vapor deposition (MOCVD) technique.

Specifically, step 52 includes the following sub-steps: (1) forming the first-type semiconductor layer 31 on the nano-patterns 22 of the epitaxial substrate 2 to cover the nano-patterns 22 and the base member 21, (2) forming the light-emitting layer 32 on a portion of the first-type semiconductor layer 31, (3) forming the second-type semiconductor layer 33 on the light-emitting layer 32, and (4) downward etching from a predetermined surface of the second-type semiconductor layer 33 through the light-emitting layer 32, until exposure of the first-type semiconductor layer 31. A semiconductor light-emitting unit 3 is thus formed Lastly, step 53 involves formation of the electrode unit 4 which is used to supply electricity to the semiconductor light-emitting unit 3.

Specifically, the electrode unit 4 consists of the bottom electrode 41 and the top electrode 42 that are made from a metal or a metal alloy with good electric conductivity and that are formed on the first-type semiconductor layer 31 and the second-type semiconductor layer 33, respectively. Since the materials and manufacturing parameters of steps 52 and 53 are well-known in the art, detailed descriptions thereof are omitted herein for the sake of brevity.

It should be noted that the zinc oxide nano-particles 100 can be directly formed on the base member 21, i.e., the etched layer 22a may be dispensed with.

To sum up, in this invention, the zinc oxide nano-particles 100 can be formed on the epitaxial substrate 2 using ion adsorption and chemical reaction which is simple and cost-effective. With the zinc oxide nano-particles 100 serving as an etch mask, the nano-patterns 22 corresponding to the zinc oxide nano-particles 100 can be formed on the epitaxial substrate 2. Moreover, the etched layer 22a can be made from a material having a refraction coefficient from that of the base member 21, leading to secondary refraction and reflection, thereby enhancing the light extraction efficiency of the LED.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A method for patterning an epitaxial substrate comprising:
    (a) forming a plurality of zinc oxide nano-particles on an epitaxial substrate by the following substeps:
        (i) dipping the epitaxial substrate in a first solution that includes zinc ammonium complex ions such that the zinc ammonium complex ions are adsorbed on the epitaxial substrate;
        (ii) subjecting the zinc ammonium complex ions adsorbed on the epitaxial substrate to a hydrolysis reaction so as to form zinc hydroxide on the epitaxial substrate; and
        (iii) subjecting the zinc hydroxide on the epitaxial substrate to a dehydration reaction to form the zinc oxide nano-particles on the epitaxial substrate;
    (b) dry-etching the epitaxial substrate exposed between the zinc oxide nano-particles to form nano-patterns below the zinc-oxide nano-particles; and
    (c) removing the zinc oxide nano-particles on the epitaxial substrate exposing said nano-patterns.

2. The method of claim 1, wherein:
    the hydrolysis reaction is conducted by dipping the epitaxial substrate in water that has a temperature not greater than 35° C.; and
    the dehydration reaction is conducted by dipping the epitaxial substrate in a second solution that includes water and that has a temperature not lower than 80° C.

3. The method of claim 2, wherein the first solution has a pH value not greater than 10, and a concentration of the zinc ammonium complex ions not less than 0.1 mol/L.

4. The method of claim 2, wherein the concentration of the zinc ammonium complex ions ranges from 0.1 mol/L to 0.2 mol/L.

5. The method of claim 2, wherein the second solution further includes ethylene glycol, a volume ratio of the ethylene glycol to the water ranging from 1:1 to 1:4.

6. The method of claim 2, wherein the temperature of the second solution is not less than 90° C.

7. The method of claim 1, wherein the epitaxial substrate includes a base member that is made of a material selected from aluminum oxide, silicon carbide, silicon and aluminum nitride, and an etched layer that is formed into the nano-patterns in step (b), that is formed on the base member and that is made of a material selected from silicon oxide, silicon oxynitride, silicon nitride and magnesium fluoride.

8. The method of claim 1, wherein the zinc oxide nano-particles have an average size ranging from 100 nm to 500 nm, and an average gap between two adjacent ones of the zinc oxide nano-particles ranges from 100 nm to 500 nm.

9. A method for forming a light-emitting diode, comprising:
(a) forming a plurality of zinc oxide nano-particles on an epitaxial substrate by the following substeps:
  (i) dipping the epitaxial substrate in a first solution that includes zinc ammonium complex ions such that the zinc ammonium complex ions are adsorbed on the epitaxial substrate;
  (ii) subjecting the zinc ammonium complex ions adsorbed on the epitaxial substrate to a hydrolysis reaction so as to form zinc hydroxide on the epitaxial substrate; and
  (iii) subjecting the zinc hydroxide on the epitaxial substrate to a dehydration reaction to form the zinc oxide nano-particles on the epitaxial substrate;
(b) dry-etching the epitaxial substrate exposed between the zinc oxide nano-particles to form nano-patterns below the zinc-oxide nano-particles; and
(c) removing the zinc oxide nano-particles on the epitaxial substrate exposing said nano-patterns;
(d) epitaxial growing a semiconductor light-emitting unit on the nano-patterns of the epitaxial substrate; and
(e) forming an electrode unit for supplying electricity to the semiconductor light-emitting unit.

10. The method of claim 9, wherein:
the hydrolysis reaction is conducted by dipping the epitaxial substrate in water that has a temperature not greater than 35° C.; and
the dehydration reaction is conducted by dipping the epitaxial substrate in a second solution that includes water and that has a temperature not lower than 80° C.

11. The method of claim 10, wherein the first solution has a pH value not greater than 10, and a concentration of the zinc ammonium complex ions is not less than 0.1 mol/L.

12. The method of claim 10, wherein the concentration of the zinc ammonium complex ions ranges from 0.1 mol/L to 0.2 mol/L.

13. The method of claim 10, wherein the second solution further includes ethylene glycol, a volume ratio of the ethylene glycol to the water ranging from 1:1 to 1:4.

14. The method of claim 10, wherein the temperature of the second solution is not less than 90° C.

15. The method of claim 9, wherein the epitaxial substrate includes a base member that is made of a material selected from aluminum oxide, silicon carbide, silicon and aluminum nitride, and an etched layer that is formed into the nano-patterns in the step (b), that is formed on the base member and that is made of a material selected from silicon oxide, silicon oxynitride, silicon nitride and magnesium fluoride.

16. The method of claim 9, wherein the zinc oxide nano-particles have an average size ranging from 100 nm to 500 nm, and an average gap between two adjacent ones of the zinc oxide nano-particles ranges from 100 nm to 500 nm.

* * * * *

UNITED STATES PATENT AND TRADEMARK OFFICE
CERTIFICATE OF CORRECTION

| | |
|---|---|
| PATENT NO. | : 8,697,460 B2 |
| APPLICATION NO. | : 13/447977 |
| DATED | : April 15, 2014 |
| INVENTOR(S) | : Lo et al. |

Page 1 of 1

It is certified that error appears in the above-identified patent and that said Letters Patent is hereby corrected as shown below:

On the Title Page item [54], in the title, delete "PATTERING" and insert --PATTERNING--

Signed and Sealed this
Twenty-fourth Day of June, 2014

Michelle K. Lee
*Deputy Director of the United States Patent and Trademark Office*

UNITED STATES PATENT AND TRADEMARK OFFICE
CERTIFICATE OF CORRECTION

| | | |
|---|---|---|
| PATENT NO. | : 8,697,460 B2 | Page 1 of 1 |
| APPLICATION NO. | : 13/447977 | |
| DATED | : April 15, 2014 | |
| INVENTOR(S) | : Lo et al. | |

It is certified that error appears in the above-identified patent and that said Letters Patent is hereby corrected as shown below:

On the Title Page item [54], and in the Specification, Column 1, line 1, in the title, delete "PATTERING" and insert --PATTERNING--

This certificate supersedes the Certificate of Correction issued June 24, 2014.

Signed and Sealed this
Fifth Day of August, 2014

Michelle K. Lee
*Deputy Director of the United States Patent and Trademark Office*